United States Patent
Hui et al.

(10) Patent No.: US 9,490,419 B2
(45) Date of Patent: Nov. 8, 2016

(54) DHCPV6 ADDRESS AUTOCONFIGURATION FOR SOURCE-ROUTED NETWORKS

(71) Applicant: Cisco Technology, Inc., San Jose, CA (US)

(72) Inventors: Jonathan W. Hui, Belmont, CA (US); Wei Hong, Berkeley, CA (US); Jean-Philippe Vasseur, Saint Martin d'Uriage (FR)

(73) Assignee: Cisco Technology, Inc., San Jose, CA (US)

(*) Notice: Subject to any disclaimer, the term of this patent is extended or adjusted under 35 U.S.C. 154(b) by 168 days.

(21) Appl. No.: 14/336,582

(22) Filed: Jul. 21, 2014

(65) Prior Publication Data

US 2016/0020988 A1 Jan. 21, 2016

(51) Int. Cl.
| H04L 12/28 | (2006.01) |
| H01L 41/12 | (2006.01) |
| H04L 29/12 | (2006.01) |
| H04W 40/24 | (2009.01) |
| H04W 84/18 | (2009.01) |

(52) U.S. Cl.
CPC ........... *H01L 41/12* (2013.01); *H04L 61/2015* (2013.01); *H04L 61/6059* (2013.01); *H04W 40/246* (2013.01); *H04W 84/18* (2013.01)

(58) Field of Classification Search
None
See application file for complete search history.

(56) References Cited

U.S. PATENT DOCUMENTS

| 7,526,562 B1 | 4/2009 | Samprathi et al. |
| 8,924,574 B2 | 12/2014 | Alex et al. |
| 2008/0183889 A1* | 7/2008 | Andreev ............... H04L 29/06 709/238 |
| 2008/0228940 A1* | 9/2008 | Thubert ............. H04L 29/12 709/238 |
| 2010/0250715 A1* | 9/2010 | Shigeta ............. H04L 29/12028 709/220 |
| 2011/0145434 A1* | 6/2011 | Ringen ................. H04L 45/00 709/238 |
| 2012/0147874 A1* | 6/2012 | Kotecha ............... H04W 8/082 370/338 |
| 2012/0226787 A1* | 9/2012 | Ait-Ameur ......... H04L 61/2053 709/222 |

(Continued)

OTHER PUBLICATIONS

Hui et al. "An IPv6 Routing Header for Source Routes with the Routing Protocol for Low-Power and Lossy Networks (RPL)"; Internet Engineering Task Force (IETF); Standards Track; Mar. 2012; pp. 1-13.
Deering et al. "Internet Protocol, Version 6 (IPv6) Specification"; Network Working Group; Standards Track; Dec. 1998; pp. 1-37.

(Continued)

*Primary Examiner* — Phirin Sam
(74) *Attorney, Agent, or Firm* — Parker Ibrahim & Berg LLC; James M. Behmke; Stephen D. LeBarron

(57) ABSTRACT

In one embodiment, first IP addresses are allocated to a plurality of nodes, respectively, in a computer network, the first IP addresses being routable IP addresses and specifically designated for routing packets in the computer network. At the same time, the plurality of nodes is allowed to submit a second IP address allocation request indicating a requested second IP address. In response to a second IP address allocation request from a particular node of the plurality of nodes, the requested second IP address of the second IP address allocation request is allocated to the particular node. The particular node is then allocated one of the first IP addresses and the requested second IP address. Also, a routing topology for routing packets in the computer network is constructed using only the first IP addresses.

21 Claims, 12 Drawing Sheets

(56) References Cited

U.S. PATENT DOCUMENTS

| | | | | |
|---|---|---|---|---|
| 2012/0297037 | A1* | 11/2012 | Kumagai | H04L 12/4641 709/222 |
| 2015/0016415 | A1* | 1/2015 | Cherian | H04W 36/0016 370/331 |
| 2015/0156224 | A1* | 6/2015 | DeLorme | H04M 7/0033 370/259 |
| 2015/0188881 | A1* | 7/2015 | Bergman | H04L 61/2007 709/218 |
| 2015/0381566 | A1* | 12/2015 | Lohner | H04L 61/2007 709/204 |
| 2016/0094520 | A1* | 3/2016 | Ogawa | H04L 63/0281 726/12 |

OTHER PUBLICATIONS

Gnawali et al. "The Minimum Rank with Hysteresis Objective Function"; Internet Engineering Task Force (IETF); Standards Track; Sep. 2012; pp. 1-13.

P. Thubert Objective Function Zero for the Routing Protocol for Low-Power and Lossy Networks (RPL); Internet Engineering Task Force (IETF); Standards Track; Mar. 2012; pp. 1-14.

Vasseur et al. "Routing Metrics Used for Path Calculation in Low-Power and Lossy Networks"; Internet Engineering Task Force (IETF); Standards Track; Mar. 2012; pp. 1-30.

Winter et al. "RPL: IPv6 Routing Protocol for Low-Power and Lossy Networks"; Internet Engineering Task Force (IETF); Standards Track; 1-157.

* cited by examiner

DHCPV6 ADDRESS AUTOCONFIGURATION FOR SOURCE-ROUTED NETWORKS

TECHNICAL FIELD

The present disclosure relates generally to computer networks, and, more particularly, to DHCPv6 address autoconfiguration for source-routed computer networks.

BACKGROUND

Low power and Lossy Networks (LLNs), e.g., sensor networks, have a myriad of applications, such as Smart Grid and Smart Cities. Various challenges are presented with LLNs, such as lossy links, low bandwidth, battery operation, low memory and/or processing capability, etc. One example routing solution to LLN challenges is a protocol called Routing Protocol for LLNs or "RPL," which is a distance vector routing protocol that builds a Destination Oriented Directed Acyclic Graph (DODAG, or simply DAG) in addition to a set of features to bound the control traffic, support local (and slow) repair, etc. The RPL architecture provides a flexible method by which each node performs DODAG discovery, construction, and maintenance.

Many existing large-scale LLNs make use of source routing. To this end, RPL specifies a so-called Non-Storing mode, where only the root of the routing topology maintains the complete routing topology and uses source routing to deliver packets to nodes within the network. Further, Request for Comments (RFC) 6554 introduces mechanisms to compact the source route entries when all entries share the same prefix with the IPv6 destination address of a packet carrying a source route header (SRH), a typical scenario in LLNs using source routing. The compaction mechanism reduces consumption of scarce resources such as channel capacity.

BRIEF DESCRIPTION OF THE DRAWINGS

The embodiments herein may be better understood by referring to the following description in conjunction with the accompanying drawings in which like reference numerals indicate identically or functionally similar elements, of which.

DESCRIPTION OF EXAMPLE EMBODIMENTS

Overview

Figure 1:
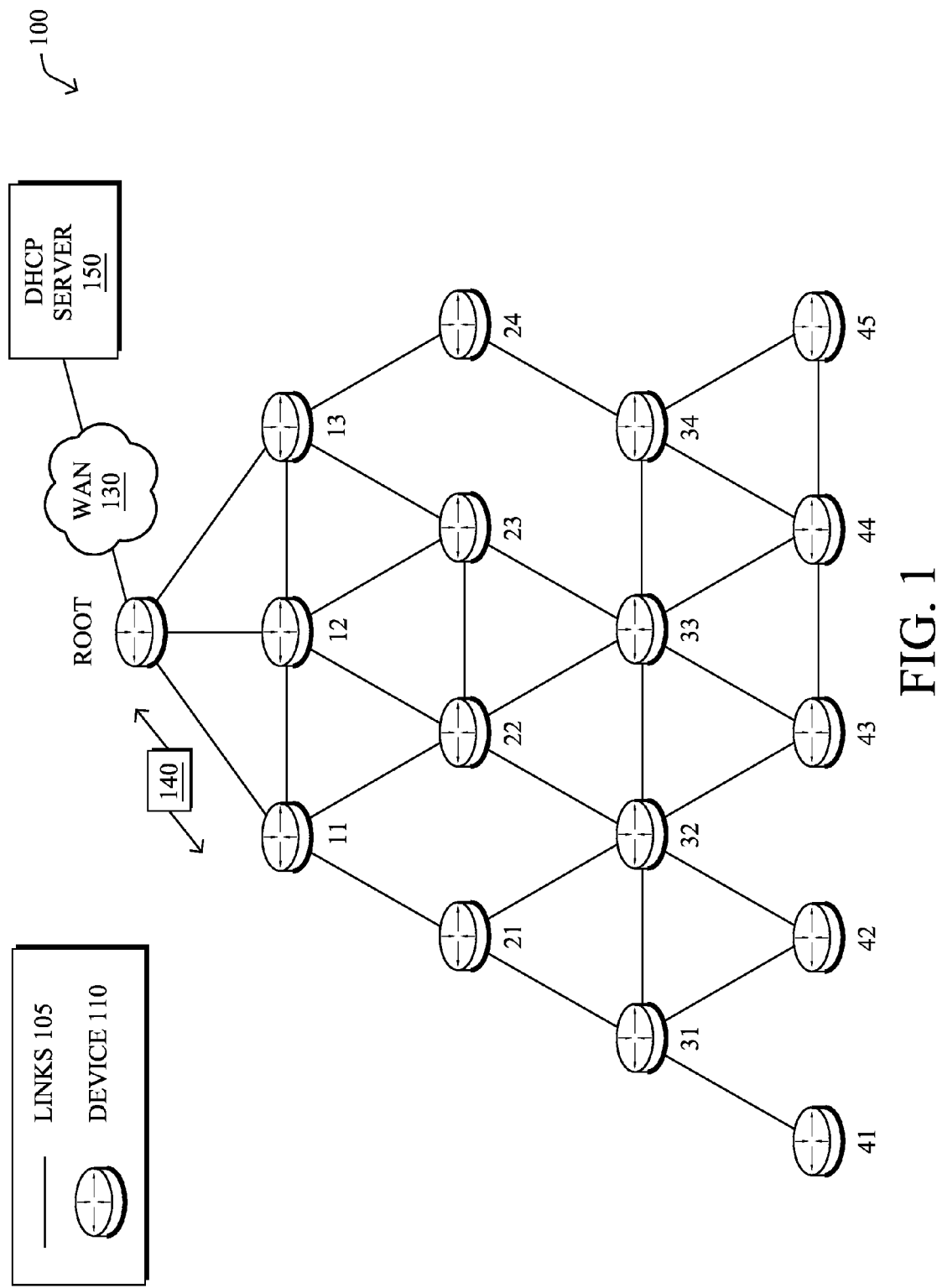
FIG. 1 illustrates an example communication network.

According to one or more embodiments of the disclosure, first IP addresses are allocated to a plurality of nodes, respectively, in a computer network, the first IP addresses being routable IP addresses and specifically designated for routing packets in the computer network. At the same time, the plurality of nodes is allowed to submit a second IP address allocation request indicating a requested second IP address. In response to a second IP address allocation request from a particular node of the plurality of nodes, the requested second IP address of the second IP address allocation request is allocated to the particular node. The particular node is then allocated one of the first IP addresses and the requested second IP address. Also, a routing topology for routing packets in the computer network is constructed using only the first IP addresses.

Description

A computer network is a geographically distributed collection of nodes interconnected by communication links and segments for transporting data between end nodes, such as personal computers and workstations, or other devices, such as sensors, etc. Many types of networks are available, ranging from local area networks (LANs) to wide area networks (WANs). LANs typically connect the nodes over dedicated private communications links located in the same general physical location, such as a building or campus. WANs, on the other hand, typically connect geographically dispersed nodes over long-distance communications links, such as common carrier telephone lines, optical lightpaths, synchronous optical networks (SONET), synchronous digital hierarchy (SDH) links, or Powerline Communications (PLC) such as IEEE 61334, IEEE 1901.2, and others. In addition, a Mobile Ad-Hoc Network (MANET) is a kind of wireless ad-hoc network, which is generally considered a self-configuring network of mobile routers (and associated hosts) connected by wireless links, the union of which forms an arbitrary topology.

Smart object networks, such as sensor networks, in particular, are a specific type of network having spatially distributed autonomous devices such as sensors, actuators, etc., that cooperatively monitor physical or environmental conditions at different locations, such as, e.g., energy/power consumption, resource consumption (e.g., water/gas/etc. for advanced metering infrastructure or "AMI" applications) temperature, pressure, vibration, sound, radiation, motion, pollutants, etc. Other types of smart objects include actuators, e.g., responsible for turning on/off an engine or perform any other actions. Sensor networks, a type of smart object network, are typically shared-media networks, such as wireless or PLC networks. That is, in addition to one or more sensors, each sensor device (node) in a sensor network may generally be equipped with a radio transceiver or other communication port such as PLC, a microcontroller, and an energy source, such as a battery. Often, smart object networks are considered field area networks (FANs), neighborhood area networks (NANs), personal area networks (PANs), etc. Generally, size and cost constraints on smart object nodes (e.g., sensors) result in corresponding constraints on resources such as energy, memory, computational speed and bandwidth.

FIG. 1 is a schematic block diagram of an example computer network 100 illustratively comprising nodes/devices 110 (e.g., labeled as shown, "root," "11," "12," . . . "45," and described in FIG. 2 below) interconnected by various methods of communication. For instance, the links 105 may be wired links or shared media (e.g., wireless links, PLC links, etc.) where certain nodes 110, such as, e.g., routers, sensors, computers, etc., may be in communication with other nodes 110, e.g., based on distance, signal strength, current operational status, location, etc. The illustrative root node, such as a field area router (FAR) of a FAN, may interconnect the local network with a WAN 130, which may house one or more other relevant devices such as a dynamic host configuration protocol (DHCP) server 150. Alternatively, the DHCP server 150 may be substituted for other management devices or servers, such as a network management server (NMS), a constrained application protocol (CoAP) server, etc. Those skilled in the art will understand that any number of nodes, devices, links, etc. may be used in the computer network, and that the view shown herein is for simplicity. Also, those skilled in the art will further understand that while the network is shown in a certain orientation, particularly with a "root" node, the network 100 is merely an example illustration that is not meant to limit the disclosure.

Data packets 140 (e.g., traffic and/or messages) may be exchanged among the nodes/devices of the computer network 100 using predefined network communication protocols such as certain known wired protocols, wireless protocols (e.g., IEEE Std. 802.15.4, WiFi, Bluetooth®, etc.), PLC protocols, or other shared-media protocols where appropriate. In this context, a protocol consists of a set of rules defining how the nodes interact with each other.

Figure 2:
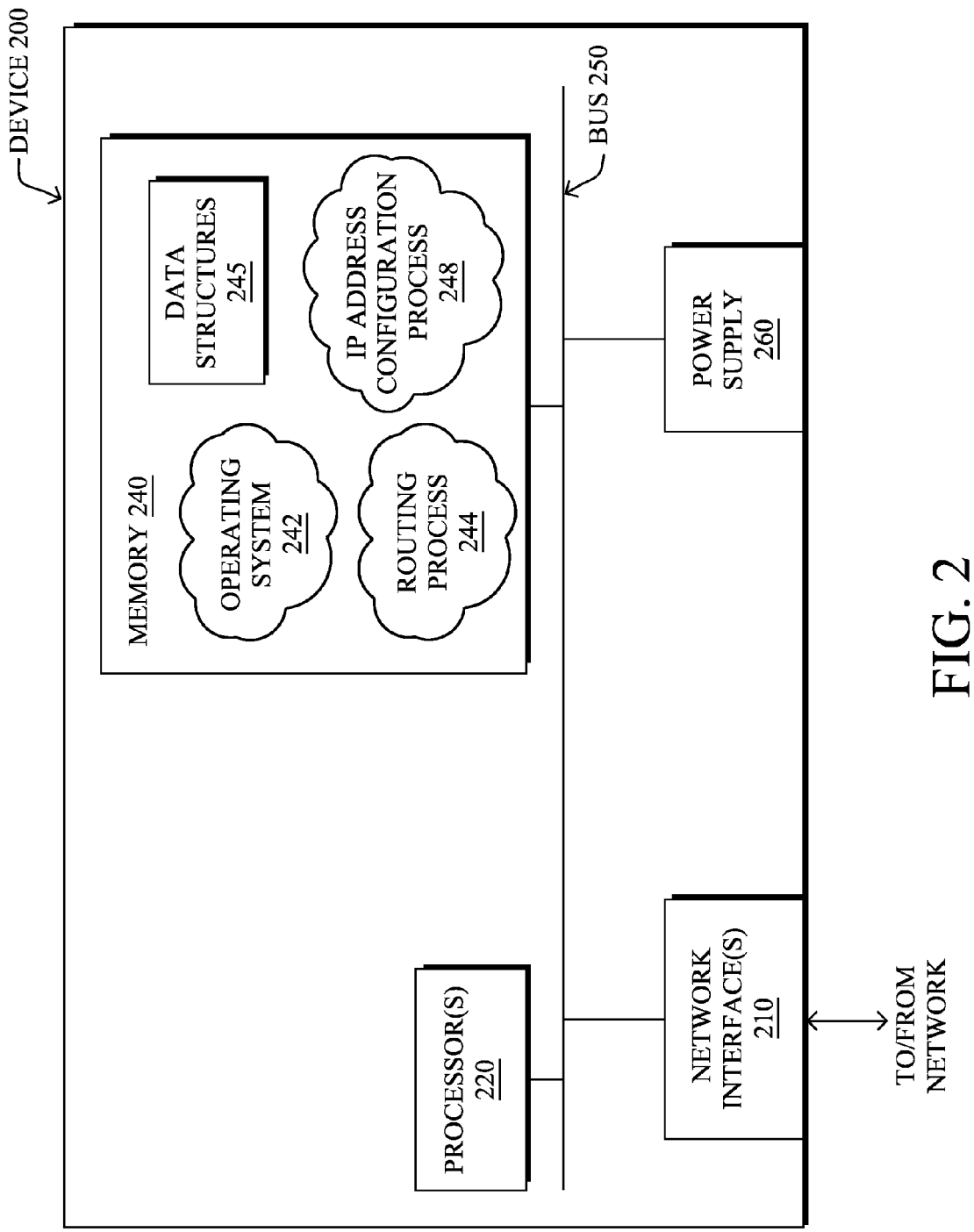
FIG. 2 illustrates an example network device/node.

FIG. 2 is a schematic block diagram of an example node/device 200 that may be used with one or more embodiments described herein, e.g., as any of the nodes or devices shown in FIG. 1 above. The device may comprise one or more network interfaces 210 (e.g., wired, wireless, PLC, etc.), at least one processor 220, and a memory 240 interconnected by a system bus 250, as well as a power supply 260 (e.g., battery, plug-in, etc.).

The network interface(s) 210 contain the mechanical, electrical, and signaling circuitry for communicating data over links 105 coupled to the network 100. The network interfaces may be configured to transmit and/or receive data using a variety of different communication protocols. Note, further, that the nodes may have two different types of network connections 210, e.g., wireless and wired/physical connections, and that the view herein is merely for illustration. Also, while the network interface 210 is shown separately from power supply 260, for PLC (where the PLC signal may be coupled to the power line feeding into the power supply) the network interface 210 may communicate through the power supply 260, or may be an integral component of the power supply.

The memory 240 comprises a plurality of storage locations that are addressable by the processor 220 and the network interfaces 210 for storing software programs and data structures associated with the embodiments described herein. Note that certain devices may have limited memory or no memory (e.g., no memory for storage other than for programs/processes operating on the device and associated caches). The processor 220 may comprise hardware elements or hardware logic adapted to execute the software programs and manipulate the data structures 245. An operating system 242, portions of which are typically resident in memory 240 and executed by the processor, functionally organizes the device by, inter alia, invoking operations in support of software processes and/or services executing on the device. These software processes and/or services may comprise a routing process/services 244 and an illustrative "IP address config" process 248, which may be configured depending upon the particular node/device within the network 100 with functionality ranging from intelligent learning machine processes to merely communicating with intelligent learning machines, as described herein. Note also that while the IP address config process 248 is shown in centralized memory 240, alternative embodiments provide for the process to be specifically operated within the network interfaces 210.

It will be apparent to those skilled in the art that other processor and memory types, including various computer-readable media, may be used to store and execute program instructions pertaining to the techniques described herein. Also, while the description illustrates various processes, it is expressly contemplated that various processes may be embodied as modules configured to operate in accordance with the techniques herein (e.g., according to the functionality of a similar process). Further, while the processes have been shown separately, those skilled in the art will appreciate that processes may be routines or modules within other processes.

Routing process (services) 244 contains computer executable instructions executed by the processor 220 to perform functions provided by one or more routing protocols, such as proactive or reactive routing protocols as will be understood by those skilled in the art. These functions may, on capable devices, be configured to manage a routing/forwarding table (a data structure 245) containing, e.g., data used to make routing/forwarding decisions. In particular, in proactive routing, connectivity is discovered and known prior to computing routes to any destination in the network, e.g., link state routing such as Open Shortest Path First (OSPF), or Intermediate-System-to-Intermediate-System (ISIS), or Optimized Link State Routing (OLSR). Reactive routing, on the other hand, discovers neighbors (i.e., does not have an a priori knowledge of network topology), and in response to a needed route to a destination, sends a route request into the network to determine which neighboring node may be used to reach the desired destination. Example reactive routing protocols may comprise Ad-hoc On-demand Distance Vector (AODV), Dynamic Source Routing (DSR), DYnamic MANET On-demand Routing (DYMO), etc. Notably, on devices not capable or configured to store routing entries, routing process 244 may consist solely of providing mechanisms necessary for source routing techniques. That is, for source routing, other devices in the network can tell the less capable devices exactly where to send the packets, and the less capable devices simply forward the packets as directed.

As noted above, low power and Lossy Networks (LLNs), e.g., certain sensor networks, may be used in a myriad of applications such as for "Smart Grid" and "Smart Cities." A number of challenges in LLNs have been presented, such as:

1) Links are generally lossy, such that a Packet Delivery Rate/Ratio (PDR) can dramatically vary due to various sources of interferences, e.g., considerably affecting the bit error rate (BER);

2) Links are generally low bandwidth, such that control plane traffic must generally be bounded and negligible compared to the low rate data traffic;

3) There are a number of use cases that require specifying a set of link and node metrics, some of them being dynamic, thus requiring specific smoothing functions to avoid routing instability, considerably draining bandwidth and energy;

4) Constraint-routing may be required by some applications, e.g., to establish routing paths that will avoid non-encrypted links, nodes running low on energy, etc.;

5) Scale of the networks may become very large, e.g., on the order of several thousands to millions of nodes; and 6) Nodes may be constrained with a low memory, a reduced processing capability, a low power supply (e.g., battery).

In other words, LLNs are a class of network in which both the routers and their interconnect are constrained: LLN routers typically operate with constraints, e.g., processing power, memory, and/or energy (battery), and their interconnects are characterized by, illustratively, high loss rates, low data rates, and/or instability. LLNs are comprised of anything from a few dozen and up to thousands or even millions of LLN routers, and support point-to-point traffic (between devices inside the LLN), point-to-multipoint traffic (from a central control point to a subset of devices inside the LLN) and multipoint-to-point traffic (from devices inside the LLN towards a central control point).

An example implementation of LLNs is an "Internet of Things" network. Loosely, the term "Internet of Things" or "IoT" may be used by those in the art to refer to uniquely identifiable objects (things) and their virtual representations in a network-based architecture. In particular, the next frontier in the evolution of the Internet is the ability to connect more than just computers and communications devices, but rather the ability to connect "objects" in general, such as lights, appliances, vehicles, HVAC (heating, ventilating, and air-conditioning), windows and window shades and blinds, doors, locks, etc. The "Internet of Things" thus generally refers to the interconnection of objects (e.g., smart objects), such as sensors and actuators, over a computer network (e.g., IP), which may be the Public Internet or a private network. Such devices have been used in the industry for decades, usually in the form of non-IP or proprietary protocols that are connected to IP networks by way of protocol translation gateways. With the emergence of a myriad of applications, such as the smart grid, smart cities, and building and industrial automation, and cars (e.g., that can interconnect millions of objects for sensing things like power quality, tire pressure, and temperature and that can actuate engines and lights), it has been of the utmost importance to extend the IP protocol suite for these networks.

An example protocol specified in an Internet Engineering Task Force (IETF) Proposed Standard, Request for Comment (RFC) 6550, entitled "RPL: IPv6 Routing Protocol for Low Power and Lossy Networks" by Winter, et al. (March 2012), provides a mechanism that supports multipoint-to-point (MP2P) traffic from devices inside the LLN towards a central control point (e.g., LLN Border Routers (LBRs) or "root nodes/devices" generally), as well as point-to-multipoint (P2MP) traffic from the central control point to the devices inside the LLN (and also point-to-point, or "P2P" traffic). RPL (pronounced "ripple") may generally be described as a distance vector routing protocol that builds a Directed Acyclic Graph (DAG) for use in routing traffic/packets 140, in addition to defining a set of features to bound the control traffic, support repair, etc. Notably, as may be appreciated by those skilled in the art, RPL also supports the concept of Multi-Topology-Routing (MTR), whereby multiple DAGs can be built to carry traffic according to individual requirements.

A DAG is a directed graph having the property that all edges (and/or vertices) are oriented in such a way that no cycles (loops) are supposed to exist. All edges are contained in paths oriented toward and terminating at one or more root nodes (e.g., "clusterheads or "sinks"), often to interconnect the devices of the DAG with a larger infrastructure, such as the Internet, a wide area network, or other domain. In addition, a Destination Oriented DAG (DODAG) is a DAG rooted at a single destination, i.e., at a single DAG root with no outgoing edges. A "parent" of a particular node within a DAG is an immediate successor of the particular node on a path towards the DAG root, such that the parent has a lower "rank" than the particular node itself, where the rank of a node identifies the node's position with respect to a DAG root (e.g., the farther away a node is from a root, the higher is the rank of that node). Further, in certain embodiments, a sibling of a node within a DAG may be defined as any neighboring node which is located at the same rank within a DAG. Note that siblings do not necessarily share a common parent, and routes between siblings are generally not part of a DAG since there is no forward progress (their rank is the same). Note also that a tree is a kind of DAG, where each device/node in the DAG generally has one parent or one preferred parent.

DAGs may generally be built (e.g., by a DAG process) based on an Objective Function (OF). The role of the Objective Function is generally to specify rules on how to build the DAG (e.g. number of parents, backup parents, etc.).

In addition, one or more metrics/constraints may be advertised by the routing protocol to optimize the DAG against. Also, the routing protocol allows for including an optional set of constraints to compute a constrained path, such as if a link or a node does not satisfy a required constraint, it is "pruned" from the candidate list when computing the best path. (Alternatively, the constraints and metrics may be separated from the OF.) Additionally, the routing protocol may include a "goal" that defines a host or set of hosts, such as a host serving as a data collection point, or a gateway providing connectivity to an external infrastructure, where a DAG's primary objective is to have the devices within the DAG be able to reach the goal. In the case where a node is unable to comply with an objective function or does not understand or support the advertised metric, it may be configured to join a DAG as a leaf node. As used herein, the various metrics, constraints, policies, etc., are considered "DAG parameters."

Illustratively, example performance metrics used to select paths (e.g., preferred parents) may comprise cost, delay, latency, bandwidth, expected transmission count (ETX), etc., while example constraints that may be placed on the route selection may comprise various reliability thresholds, restrictions on battery operation, multipath diversity, bandwidth requirements, transmission types (e.g., wired, wireless, etc.). The OF may provide rules defining the load balancing requirements, such as a number of selected parents (e.g., single parent trees or multi-parent DAGs). Notably, an example for how routing metrics and constraints may be obtained may be found in an IETF RFC, entitled "Routing Metrics used for Path Calculation in Low Power and Lossy Networks" <RFC 6551> by Vasseur, et al. (March 2012 version). Further, an example OF (e.g., a default OF) may be found in an IETF RFC, entitled "RPL Objective Function 0"<RFC 6552> by Thubert (March 2012 version) and "The Minimum Rank Objective Function with Hysteresis"<RFC 6719> by O. Gnawali et al. (September 2012 version).

Building a DAG may utilize a discovery mechanism to build a logical representation of the network, and route dissemination to establish state within the network so that routers know how to forward packets toward their ultimate destination. Note that a "router" refers to a device that can forward as well as generate traffic, while a "host" refers to a device that can generate but does not forward traffic. Also, a "leaf" may be used to generally describe a non-router that is connected to a DAG by one or more routers, but cannot itself forward traffic received on the DAG to another router on the DAG. Control messages may be transmitted among the devices within the network for discovery and route dissemination when building a DAG.

According to the illustrative RPL protocol, a DODAG Information Object (DIO) is a type of DAG discovery message that carries information that allows a node to discover a RPL Instance, learn its configuration parameters, select a DODAG parent set, and maintain the upward routing topology. In addition, a Destination Advertisement Object (DAO) is a type of DAG discovery reply message that conveys destination information upwards along the DODAG so that a DODAG root (and other intermediate nodes) can provision downward routes. A DAO message includes prefix information to identify destinations, a capability to record routes in support of source routing, and information to determine the freshness of a particular advertisement. Notably, "upward" or "up" paths are routes that lead in the direction from leaf nodes towards DAG roots, e.g., following the orientation of the edges within the DAG. Conversely, "downward" or "down" paths are routes that lead in the direction from DAG roots towards leaf nodes, e.g., generally going in the opposite direction to the upward messages within the DAG.

Generally, a DAG discovery request (e.g., DIO) message is transmitted from the root device(s) of the DAG downward toward the leaves, informing each successive receiving device how to reach the root device (that is, from where the request is received is generally the direction of the root). Accordingly, a DAG is created in the upward direction toward the root device. The DAG discovery reply (e.g., DAO) may then be returned from the leaves to the root device(s) (unless unnecessary, such as for UP flows only), informing each successive receiving device in the other direction how to reach the leaves for downward routes. Nodes that are capable of maintaining routing state may aggregate routes from DAO messages that they receive before transmitting a DAO message. Nodes that are not capable of maintaining routing state, however, may attach a next-hop parent address. The DAO message is then sent directly to the DODAG root that can in turn build the topology and locally compute downward routes to all nodes in the DODAG. Such nodes are then reachable using source routing techniques over regions of the DAG that are incapable of storing downward routing state. In addition, RPL also specifies a message called the DIS (DODAG Information Solicitation) message that is sent under specific circumstances so as to discover DAG neighbors and join a DAG or restore connectivity.

Figure 3:
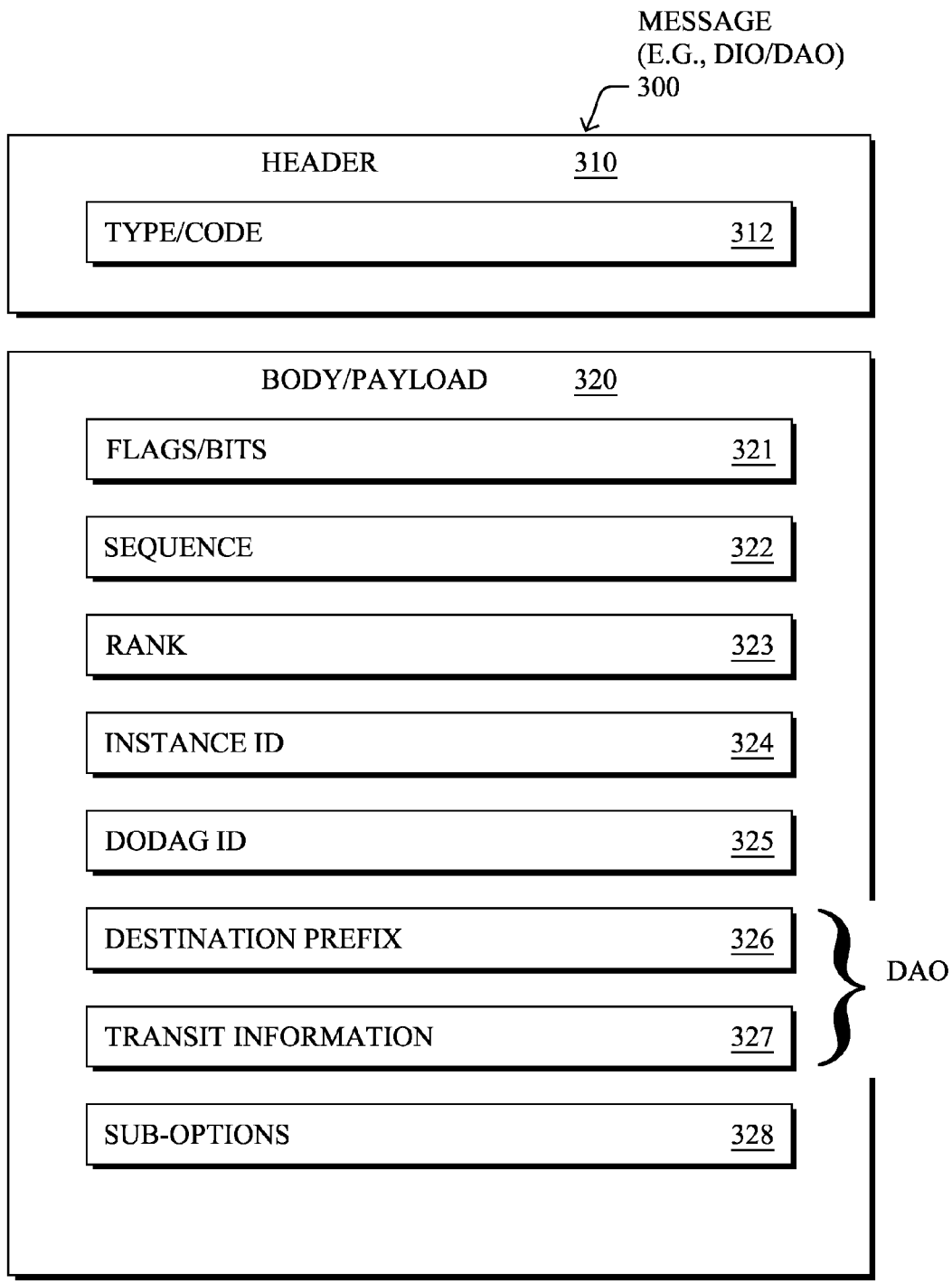
FIG. 3 illustrates an example control message.

FIG. 3 illustrates an example simplified control message format 300 that may be used for discovery and route dissemination when building a DAG, e.g., as a DIO, DAO, or DIS message. Message 300 illustratively comprises a header 310 with one or more fields 312 that identify the type of message (e.g., a RPL control message), and a specific code indicating the specific type of message, e.g., a DIO, DAO, or DIS. Within the body/payload 320 of the message may be a plurality of fields used to relay the pertinent information. In particular, the fields may comprise various flags/bits 321, a sequence number 322, a rank value 323, an instance ID 324, a DODAG ID 325, and other fields, each as may be appreciated in more detail by those skilled in the art. Further, for DAO messages, additional fields for destination prefixes 326 and a transit information field 327 may also be included, among others (e.g., DAO_Sequence used for ACKs, etc.). For any type of message 300, one or more additional sub-option fields 328 may be used to supply additional or custom information within the message 300. For instance, an objective code point (OCP) sub-option field may be used within a DIO to carry codes specifying a particular objective function (OF) to be used for building the associated DAG. Alternatively, sub-option fields 328 may be used to carry other certain information within a message 300, such as indications, requests, capabilities, lists, notifications, etc., as may be described herein, e.g., in one or more type-length-value (TLV) fields.

Figure 4:
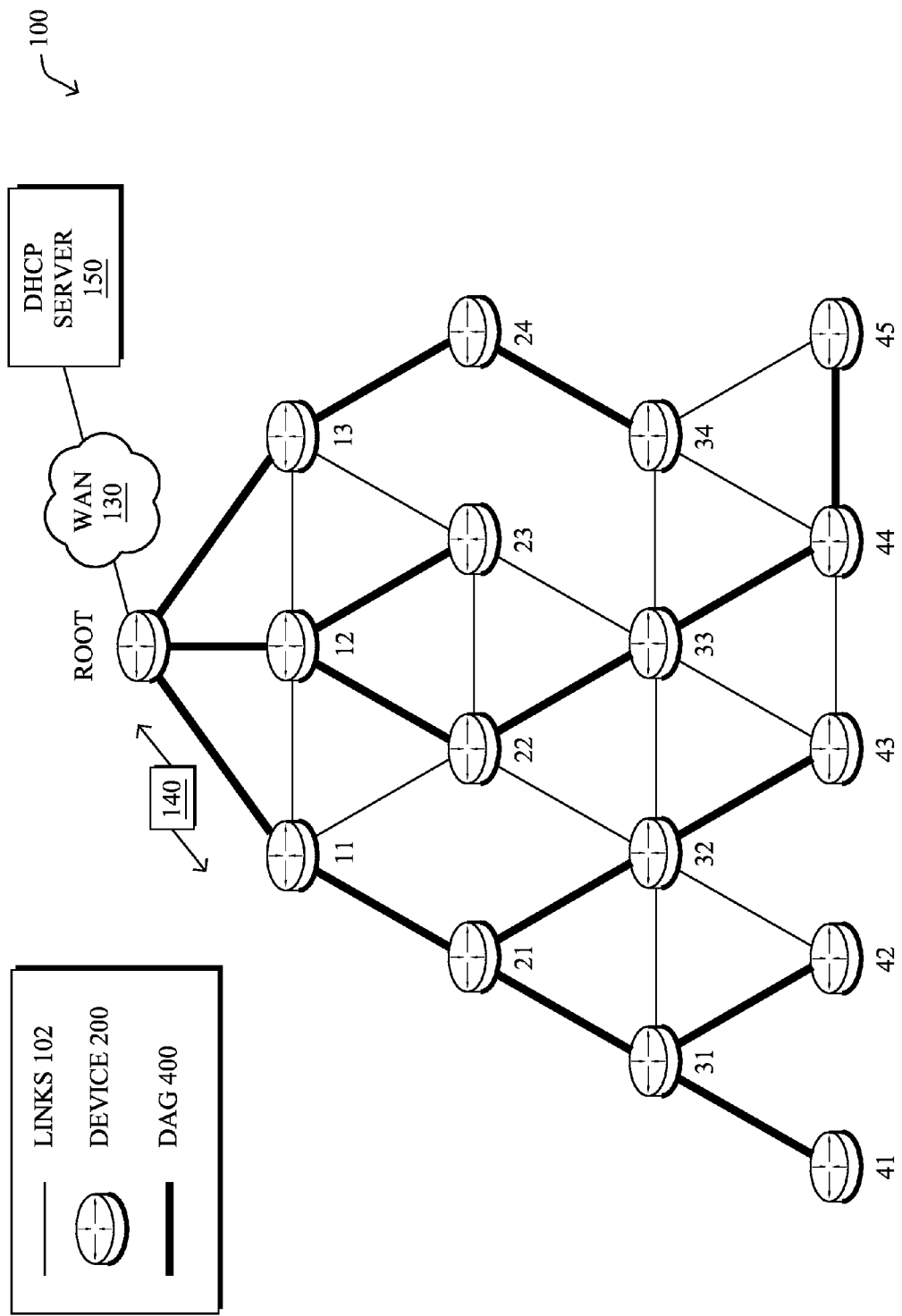
FIG. 4 illustrates an example directed acyclic graph (DAG) in the communication network of FIG. 1.

FIG. 4 illustrates an example simplified DAG that may be created, e.g., through the techniques described above, within network 100 of FIG. 1. For instance, certain links 105 may be selected for each node to communicate with a particular parent (and thus, in the reverse, to communicate with a child, if one exists). These selected links form the DAG 410 (shown as bolded lines), which extends from the root node toward one or more leaf nodes (nodes without children). Traffic/packets 140 (shown in FIG. 1) may then traverse the DAG 410 in either the upward direction toward the root or downward toward the leaf nodes, particularly as described herein.

As noted above, many existing large-scale mesh networks deployed for Smart Grid AMI make use of source routing for a number of reasons. First, Smart Grid AMI devices typically have severe resource constraints in computation, memory, and communication. Second, Smart Grid AMI networks typically involve thousands to millions of nodes, making routing and managing the routing state a challenging problem. Third, traffic flows in Smart Grid AMI networks typically flow through a small number of points (e.g., pole-top routers that connect Smart Grid mesh networks to a WAN). For these reasons, source-routing is an especially attractive mechanism for Smart Grid AMI networks. Note that a number of IoT applications also fit this model well, including water management applications, smart cities, etc.

Along these lines, RPL specifies a Non-Storing mode, where only the root of the routing topology maintains the complete routing topology and uses source routing to deliver packets to nodes within the mesh. Also, RFC 6554 specifies an IPv6 routing header for use with the RPL Non-Storing mode, where all IPv6 addresses (except for the last hop) share the same prefix bytes to allow for compression. For example, all intermediate addresses may have the form A::X, A::Y, A::Z, such that a larger prefix for A allows for a higher compression ratio. Thus, the source route entries can be compacted when all entries share the same prefix with the IPv6 destination address of a packet carrying a source route header (SRH), a typical scenario in LLNs using source routing.

As a result, existing mesh networks implement RPL with Non-Storing mode, and RFC 6554 provides the opportunity to minimize the overhead of source route headers. Though, in certain situations, compressible addresses may not be desirable. Instead, it can often be more user-friendly and convenient for the end-users to choose IP addresses and assign them to their own devices. For instance, existing customers (e.g., utilities) may prefer to assign IP addresses with interface identifiers (IIDs) derived from each device's MAC address. However, in this instance, because IIDs derived from MAC addresses are 8 bytes in length, only 8 bytes of IPv6 prefix can be compressed for each source route entry, resulting in a compression ratio of two at best. In other words, allowing end-users to choose and assign their own IP addresses creates greater flexibility for the end-user, but simultaneously harms the IP addresses' compressibility and causes additional processing overhead. This overhead can be very high in the presence of long paths, especially when considering that message payloads are typically small in LLNs.

DHCPv6 Address Autoconfiguration for Source-Routed Networks

The techniques herein propose a method for building a routable IPv6 address topology that maximizes the compression ratio of source route headers while still allowing end-customers to assign and use whatever IPv6 addresses they wish to end-devices in a computer network by using any suitable tactics for assigning IP addresses, such as issuing commands in the computer system. The disclosed embodiments involve, for example: (i) allowing DHCPv6 clients to request multiple IPv6 addresses with different allocation policies, (ii) allocating routable IPv6 addresses to maximize efficiency of the routing protocol (e.g., first-fit for RPL source routing), (iii) allocating additional IPv6 addresses as desired by the end-user or applications, (iv) having RPL build a routing topology using the routable IPv6 addresses and overlaying additional end-user/application-specific IPv6 addresses, (v) building RPL source routes using only the routable IPv6 addresses as intermediate hops to maximize the compression ratio, and (vi) dynamically determining whether to use routable addresses for the intermediate hops to maximize compression.

Specifically, according to one or more embodiments of the disclosure as described in detail below, first IP addresses are allocated to a plurality of nodes, respectively, in a computer network, the first IP addresses being routable IP addresses and specifically designated for routing packets in the computer network. At the same time, the plurality of nodes is allowed to submit a second IP address allocation request indicating a requested second IP address. In response to a second IP address allocation request from a particular node of the plurality of nodes, the requested second IP address of the second IP address allocation request is allocated to the particular node. The particular node is then allocated one of the first IP addresses and the requested second IP address. Also, a routing topology for routing packets in the computer network is constructed using only the first IP addresses.

Illustratively, the techniques described herein may be performed by hardware, software, and/or firmware, such as in accordance with the "IP address config" process 248, which may contain computer executable instructions executed by the processor 220 (or independent processor of interfaces 210) to perform functions relating to the techniques described herein, e.g., in conjunction with routing process 244. For example, the techniques herein may be treated as extensions to conventional protocols, such as the various PLC protocols or wireless communication protocols, and as such, may be processed by similar components understood in the art that execute those protocols, accordingly. Moreover, the techniques described herein are applicable to all versions of the Internet Protocol (e.g., IP, IPv4, IPv6, etc.). Thus, the present disclosure is not limited to a particular IP version, and particular IP versions are referenced merely for illustrative purposes. Similarly, the techniques described herein are applicable to all versions of the Dynamic Host Configuration Protocol (e.g., DHCP, DHCPv6, etc.), and thus the present disclosure is not limited to a particular DHCP version. Thus, the present disclosure is not limited to a particular DHCP version, and particular DHCP versions are referenced merely for illustrative purposes.

Operationally, the disclosed embodiments allow for customers to assign IP addresses using whatever policy they wish, while also maximizing compression ratios for RPL source route headers. That is, devices can request different kinds of IP addresses for various uses (e.g., routing, end-user, etc.), and the appropriate IP address is chosen based on the application. This may be accomplishing by allowing nodes in the network (e.g., DHCP client nodes) to request different kinds of IP addresses based on their respective application and utilizing DHCP to auto-configure the requested IP addresses.

Figure 5:
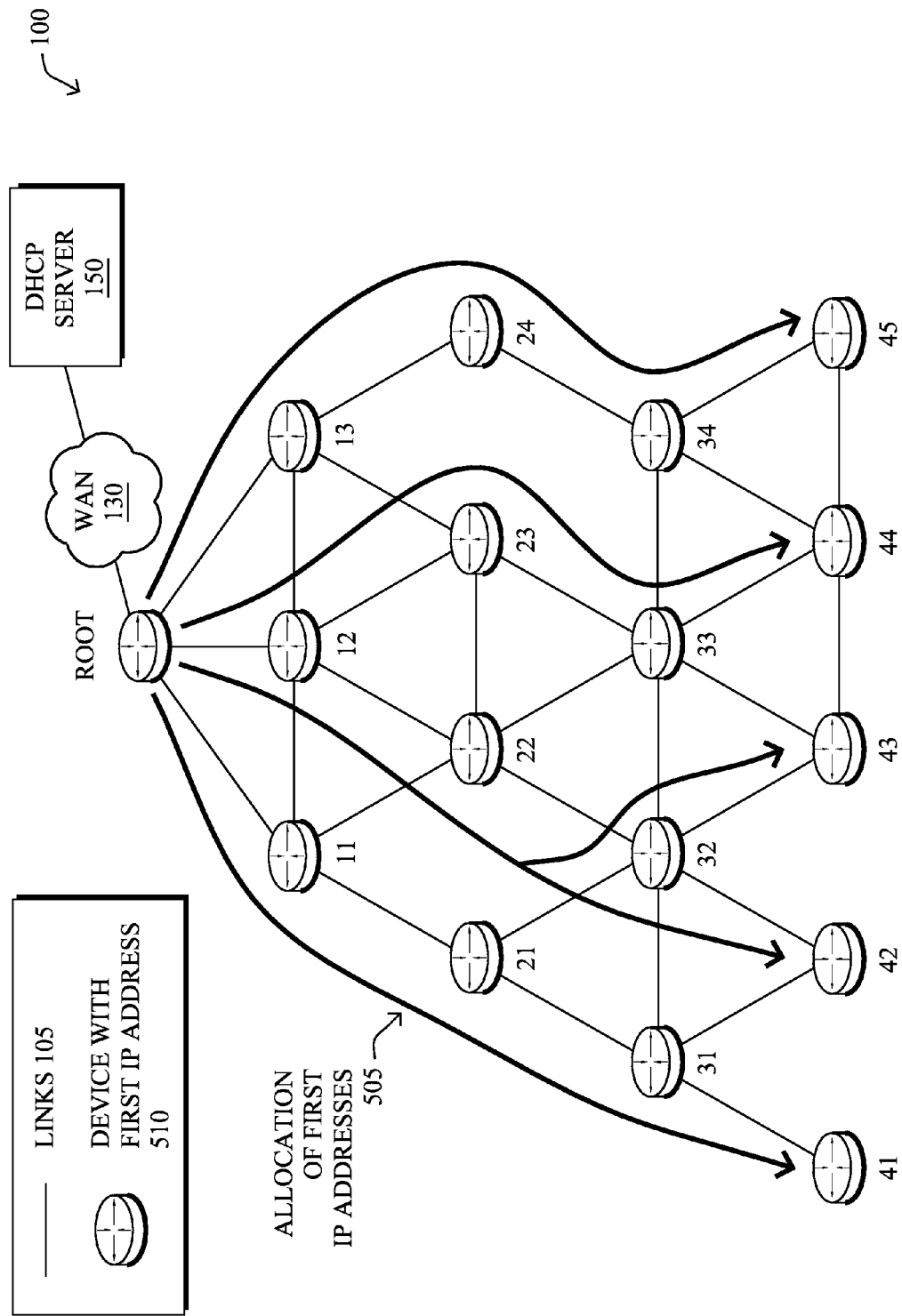
FIG. 5 illustrates an example of allocating first IP addresses to a plurality of nodes in the network.

FIG. 5 illustrates an example of allocating first IP addresses to a plurality of nodes in the network. As shown in FIG. 5, first IP addresses can be allocated to a plurality of nodes, respectively, in the network 100 (e.g., shown as reference numeral 505). The first IP addresses may be routable IP addresses and specifically designated for routing packets in the computer network. As a result, the network 100 may comprise multiple devices 510 with a first IP address interconnected via communication links 105, where the first IP address of each device 510 is used specifically for packet routing purposes and building a routing topology.

The first IP addresses (e.g., routable IP addresses) may be allocated accordingly to an allocation policy. The allocation policy for the routable IP addresses may be chosen to maximize efficiency of the routing protocol. For example, IP addresses for use with RPL source routing may be chosen from a first-fit algorithm, involving minimizing the number of IID bits used to identify interfaces. Minimizing IID bits results in maximizing the number of prefix bits that all source route addresses share, thereby increasing the compression ratio. That is, all intermediate addresses may have the form A::X, A::Y, A::Z, such that a larger prefix for A allows for a higher compression ratio. Thus, the source route entries can be compacted when all entries share the same prefix with the IPv6 destination address of a packet carrying a source route header (SRH), a typical scenario in LLNs using source routing.

Figure 6A:
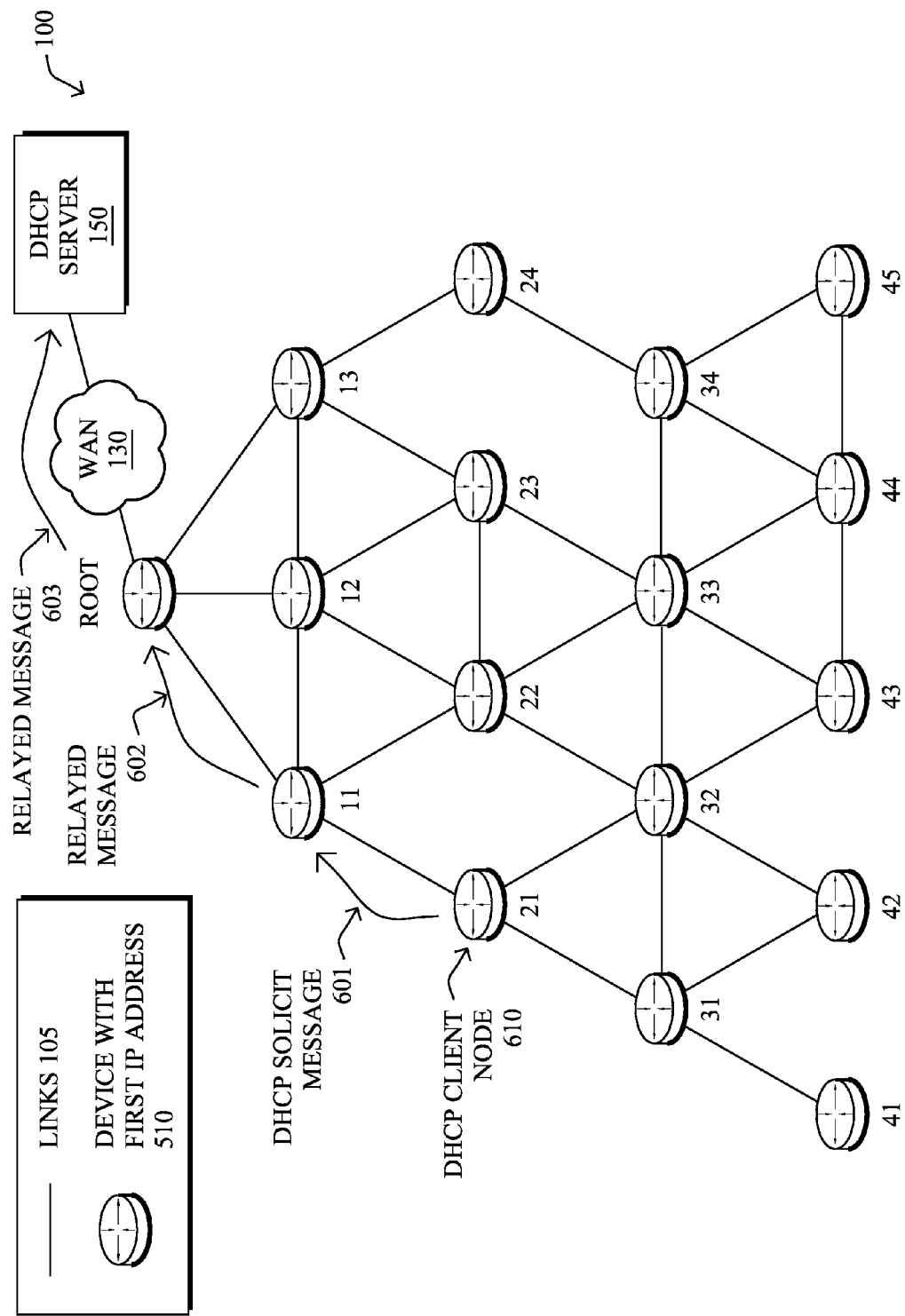
FIGS. 6A and 6B illustrate an example request and allocation of a second IP address using DHCP-based techniques in the network.
Figure 6B:
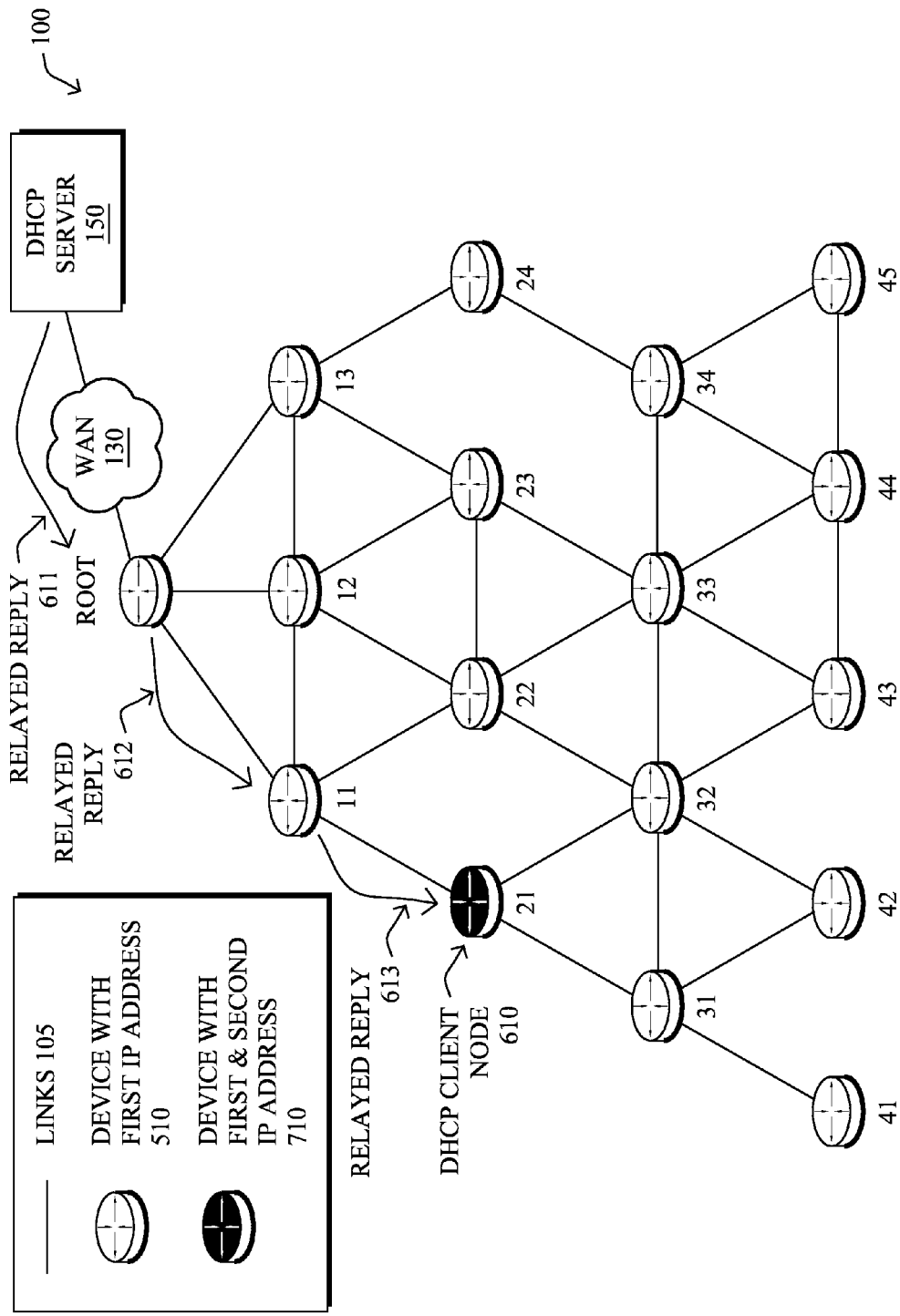

In addition to the first, routable IP addresses, the devices 510 (e.g., DHCP client devices) may request any other kind of IP address (e.g., "second IP address") for other applications. To this point, FIGS. 6A and 6B illustrate an example request and allocation of a second IP address using DHCP-based techniques. As is known in the art, when the DHCP server 150 receives a "discover" message from a DHCP client 610 requesting an IP address, as well as other configuration parameters, it constructs the set of parameters corresponding to the client's request from a stored DHCP configuration file (not shown). Then, the DHCP server 150 constructs an "offer" message containing the client's configuration parameters (including the IP address) and sends it to the DHCP client 610. Then, the DHCP server 150 waits for a "request" from the DHCP client 610 accepting the parameters and address. After the DHCP client 610 accepts the offered IP address (and/or other parameters), the DHCP server 150 sends an "ack" (acknowledgment) message completing the allocation process.

Illustratively, a simplified DHCP configuration process is shown in FIG. 6A, the DHCP client node 610 (which is already allocated a first IP address) may request a second IP address according to the typical DHCP automatic configuration process described above. For example, the DHCP client node 610 may send a DHCP solicit message 601 toward the DHCP server 150. The DHCP solicit message 601 from the DHCP client node 610 may represent the "discover" message, the "request" message, or both. The DHCP solicit message 601 request may also represent a "second IP address allocation request," which indicates a requested second IP address. The DHCP solicit message 601 may be relayed along intermediate hops any number of times (e.g., shown as reference numerals 602 and 603) on a communication route to the DHCP server 150. Illustratively, the DHCP solicit message 601 may be transmitted through the WAN 130 in order to reach the DHCP server 150.

Then, as shown in FIG. 6B, the DHCP server 150 may assign the requested second IP address to the DHCP client node 610 according to the typical DHCP automatic configuration process described above. Upon receiving the relayed DHCP solicit message 601 indicating the requested second IP address, the DHCP server 150 can send a DHCP reply 611, which may be similarly relayed any number of times (e.g., shown as reference numerals 612 and 613), toward the DHCP client node 610. The DHCP reply 611 from the DHCP server 150 may represent the "offer" message, the "ack" message, or both. The DHCP reply 611 may finalize the second IP address allocation process, whereby the DHCP client node 610 is consequently allocated the requested second IP address, in addition to the routable first IP address. The client node is thus shown as device 710 having a first and second IP address, and other network devices can communicate with the device 710 using either the first or second IP address that has been allocated to the device. Therefore, when communicating with a node 710 having a first and second IP address, it may be determined which of the node's first IP address or second IP address would be appropriate based on a type of the communication (e.g., routing, end-user, etc.).

Like the first IP addresses, the second IP addresses may be allocated according to various allocation policies, as well. For example, the customer/end-user may specify an IP address allocation policy where the IID is derived from the MAC address (e.g., EUI-64 in the case of IEEE 802.15.4). The IP address type/policy may be specified in the DHCP solicit/request message 601 using a DHCP vendor-specific information option.

In the alternative, the user may explicitly request a set of nodes 510 to receive an IP address where the IID is derived from the MAC address. In other words, the second IP address may be allocated to one or more nodes 510 without any DHCP solicitation from a DHCP client node 610. This may be helpful in cases where the user needs to perform troubleshooting, for example.

Figure 7:
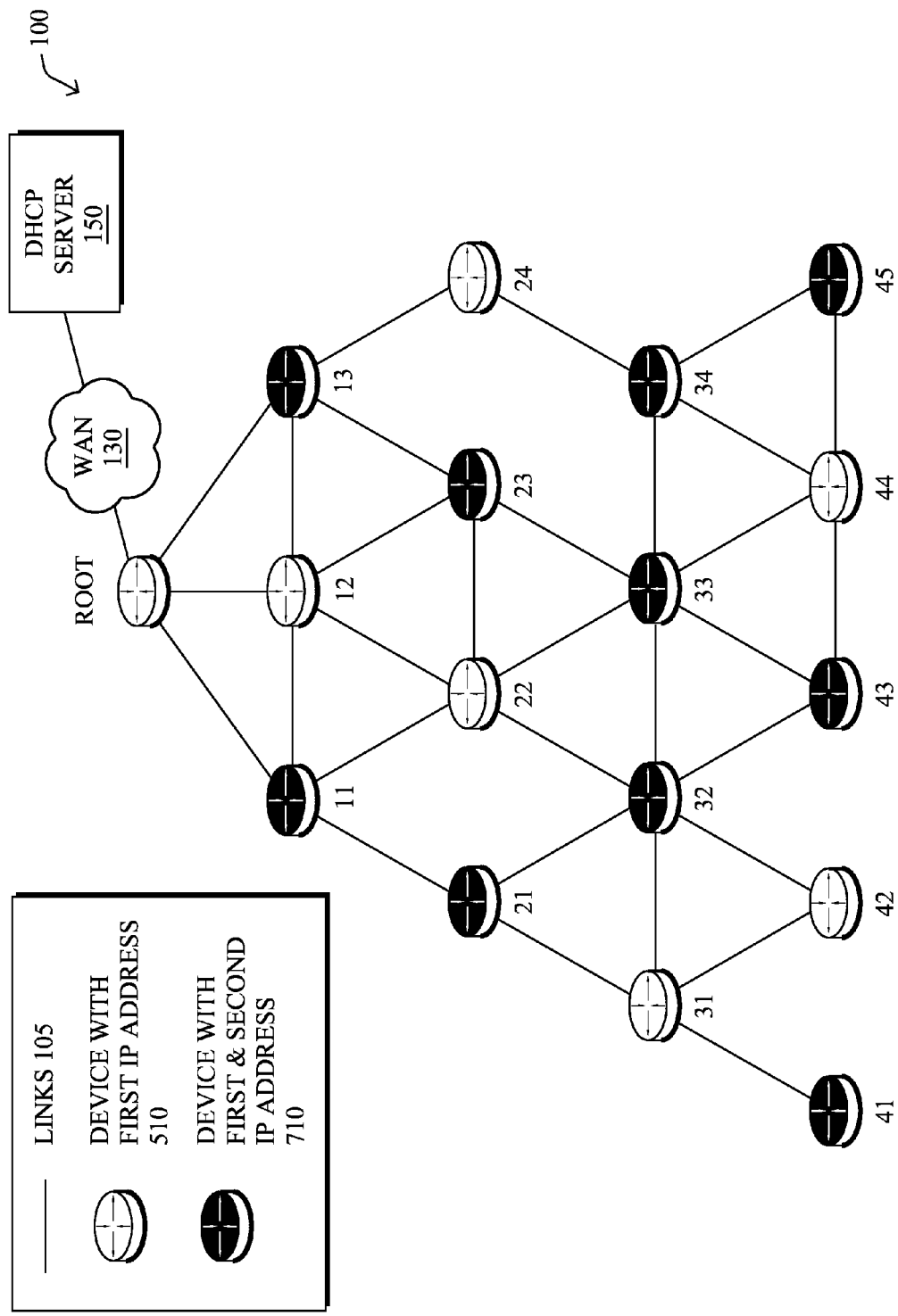
FIG. 7 illustrates an example network configuration where nodes have a first IP address and nodes having a first and second IP address.

By allocating the routable first IP addresses to a plurality of nodes in the network 100, while also allowing the plurality of nodes to request a second IP address, the network 100 may comprise nodes 510 having only the routable first IP address (e.g., where no second IP address allocation request has been sent), as well as nodes 710 having both the routable first IP address and the requested second IP address, as shown in FIG. 7. In other words, the nodes in the network 100 may have multiple IP addresses, e.g., one first IP address for routing and one or more second IP addresses for application-based purposes. Thus, the manner in which the IP addresses are deployed over a RPL network can be optimized by allowing good compression, while also providing added flexibility to the end-user.

Figure 8:
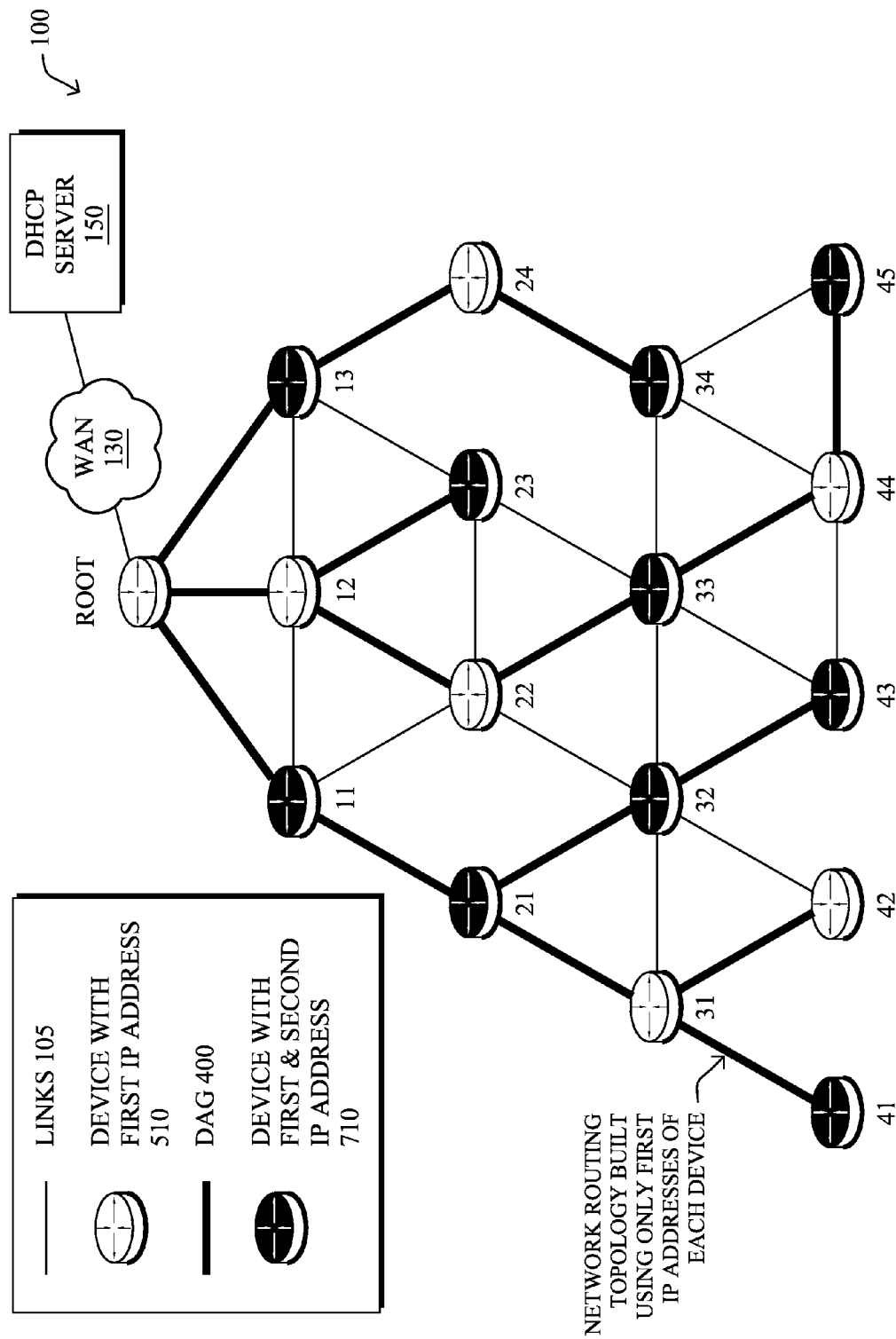
FIG. 8 illustrates an example routing topology constructed using only the first IP addresses.

FIG. 8 illustrates an example routing topology constructed using only the first IP addresses. As shown in FIG. 8, a DAG 400 may be formulated in the network 100, in the manner explained above. And in doing so, a routing topology for routing packets in the computer network may be built using only the first IP addresses of each device, even if some of those devices have also been allocated one or more second IP addresses (e.g., devices 710).

To this end, routers in the network 100 may be configured to use only their assigned routable first IP addresses. In the case of RPL, as explained above, RPL routers (e.g., devices which can forward (or generate) traffic toward a destination along a path based on the RPL routing topology) announce their presence using RPL DIO messages and include their routable IP address as the IP source address. RPL routers periodically send RPL DAO messages to the DAG root node and can include RPL Transit Information Options to specify the IPv6 addresses of their parents. Thus, with respect to RPL, the RPL Transit Option may only carry the routable first IP addresses. In other words, the root node can construct a complete routing topology that consists only of the routable first IP addresses, as is illustrated in FIG. 8. Consequently, the routable first IP addresses can be artificially separated from the other second IP addresses assigned in the same network to maximize the ability to compress the routable IP addresses using any suitable compression algorithm (e.g., by maximizing a bit-length of a common IP address prefix, as explained in RFC 6554) and reduce overhead in the network.

Furthermore, a second IP address of a node 710 having a first and a second IP address can be overlaid on the routing topology which is constructed using only the first IP addresses. To this end, the routing topology can include optional second IP addresses in order to forward packets to one or more second IP addresses when necessary. In the case of RPL, RPL routers can include RPL target options for any additional IP addresses (e.g., second IP addresses) that were allocated based on other policies, such as where an IID is derived from the MAC address. This information can allow the root node to overlay any of the second IP addresses on the routable first IP address-based topology. Therefore, the root node can construct paths using the routable first IP addresses to reach the other second IP addresses assigned to devices within the mesh.

Figure 9:
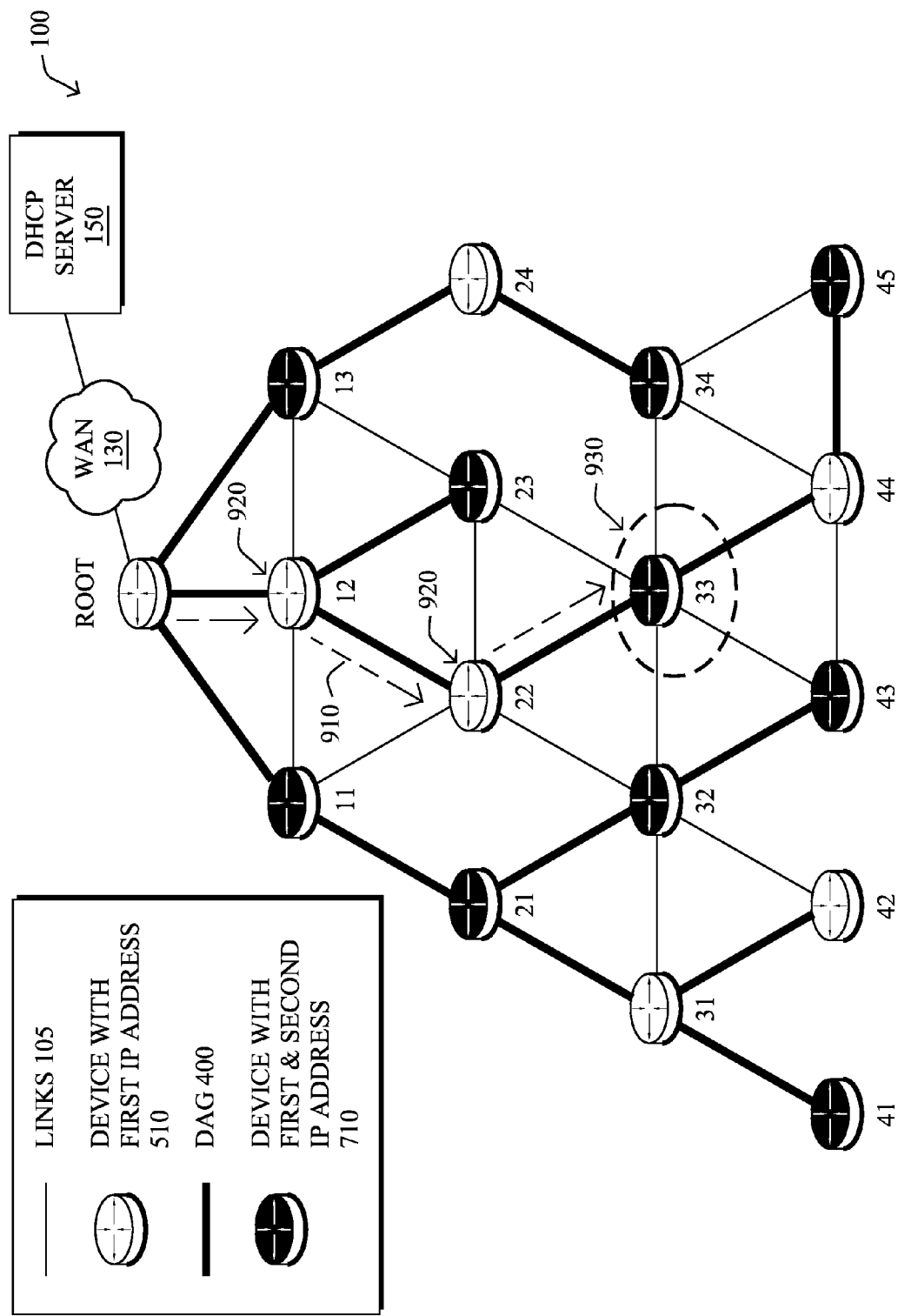
FIG. 9 illustrates an example transmission route in the network.

FIG. 9 illustrates an example transmission route in the network. As shown in FIG. 9, a transmitting node (e.g., the root node, as shown in FIG. 9) may transmit a data packet along a transmission route 910, which includes one or more intermediate hops 920, toward a destination 930. The transmission route 910 may be constructed (e.g., by the root node) such that only the routable first IP addresses are used as the one or more intermediate hops 920, and either one of the first IP addresses or a requested second IP address is used as the destination 930. Using an appropriate routable first IP address allocation policy, such as the first-fit algorithm, can help maximize the benefit of the source-route header compression mechanisms (e.g., as defined in RFC 6554 or any other suitable compression algorithm), as described above. Because the first-fit algorithm minimizes the number of bits used in the IID, the intermediate hops will contain first IP addresses that share more prefix bits, thus allowing for higher compression ratio.

Additionally, or alternatively, it may be dynamically determined whether to use routable addresses for the intermediate hops to maximize compression if this is indeed worth it. That is, in certain situations (e.g., where DHCP traffic should be reduced or the volume of IP addresses maintained at a particular node should be reduced), it may be better to not use DHCP at all, but rather to have devices derive their own IP addresses (e.g., from the MAC address) and use them for both applications and routing. Thus, it may be dynamically determined whether it would be disadvantageous (e.g., too costly) to limit the one or more intermediate hops 920 to only first IP addresses. Then, the transmission route 910 can be constructed based on the determination, where a second IP address may be used as one of the intermediate hops 920 only if it would be too costly to use only the routable first IP addresses. For example, in the case of a small diameter network (i.e., the longest of all the calculated path lengths is relatively small), it may be beneficial to only use IP addresses having IIDs derived from the MAC address for all nodes (i.e., the second IP addresses), which results in user-friendly source route headers for debugging purposes. Thus, it may be beneficial at times to construct transmission routes with second IP addresses as the one or more intermediate hops 920, even at the extra cost of lower compression ratios.

Figure 10:
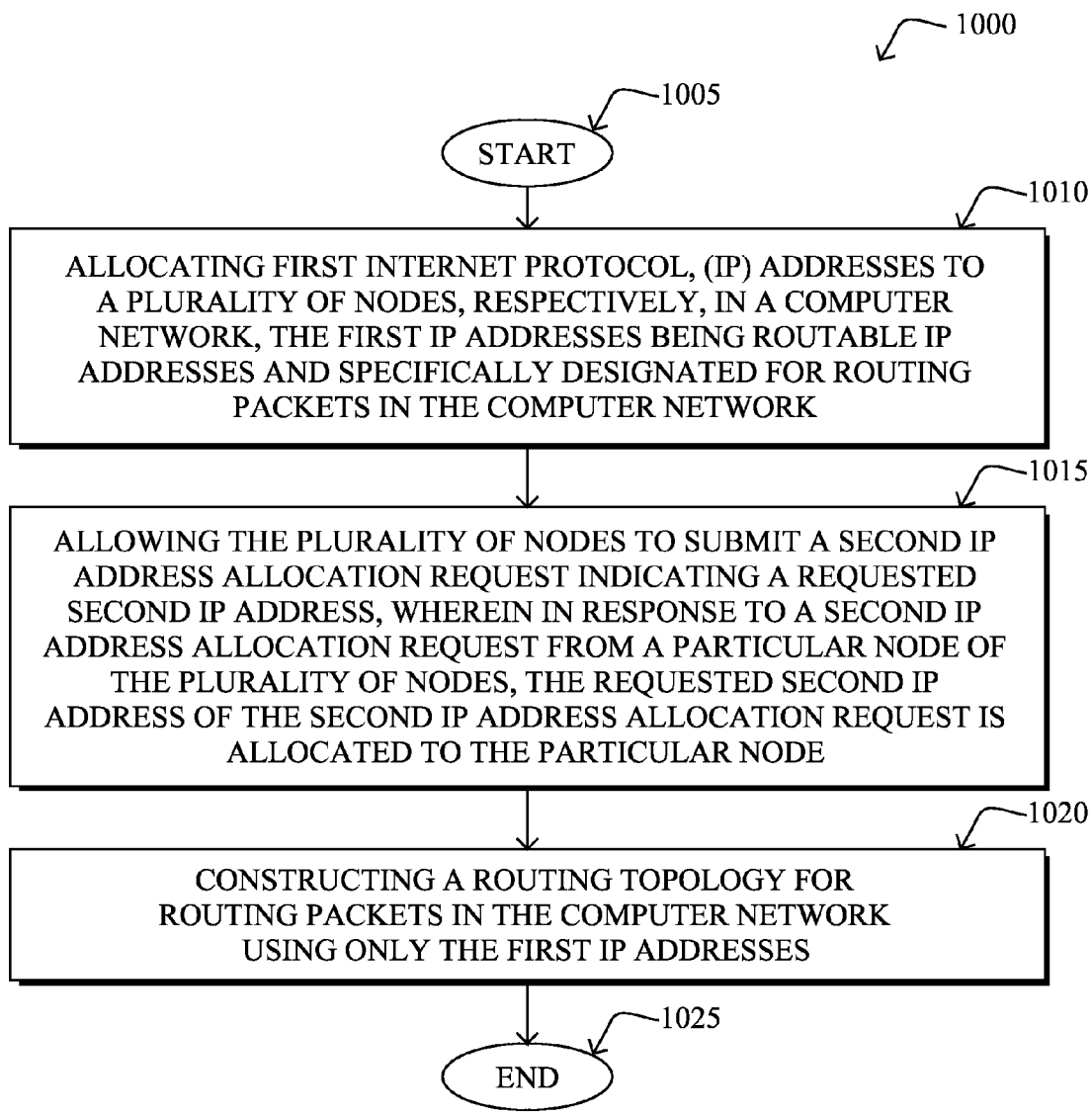
FIG. 10 illustrates an example simplified procedure for allocating a first and a second IP address to one or more nodes in a network.

FIG. 10 illustrates an example simplified procedure for allocating a first and a second IP address to one or more nodes in a network in accordance with one or more embodiments described herein. The procedure 1000 may start at step 1005, and continues to step 1010, where, as described in greater detail above, a plurality of nodes are allocated a first IP address, and the nodes are allowed to request a second IP address according to an end-user's preference.

At step 1010, first IP addresses are allocated to a plurality of nodes, respectively, in a computer network. The first IP addresses are routable IP addresses and specifically designated for routing packets in the computer network. As a result, the network 100 may comprise multiple devices 510 with a first IP address interconnected via communication links 105, where the first IP address of each device 510 is used specifically for packet routing purposes and building a routing topology. The first IP addresses may be allocated, for example, by the root node (e.g., FAR) in the computer network.

At step 1015, the plurality of nodes are allowed to submit a second IP address allocation request indicating a requested second IP address. In response to a second IP address allocation request from a particular node of the plurality of nodes, the requested second IP address of the second IP address allocation request is allocated to the particular node. The second IP address may, for example, by automatically configured using DHCP. In the alternative, the user may explicitly request a set of nodes 510 to receive an IP address where the IID is derived from the MAC address. In other words, the second IP address may be allocated to one or more nodes 510 without any DHCP solicitation from a DHCP client node 610. This may be helpful in cases where the user needs to perform troubleshooting, for example. That is, the particular node is allocated one of the first IP addresses and the requested second IP address.

At step 1020, a routing topology for routing packets in the computer network is constructed using only the first IP addresses. Consequently, the routable first IP addresses can be artificially separated from the other second IP addresses assigned in the same network to maximize the ability to compress the prefixes of the routable IP addresses and reduce overhead in the network.

The procedure illustrative ends at step 1025. The techniques by which the steps of procedure 1000 may be performed, as well as ancillary procedures and parameters, are described in detail above.

Figure 11:
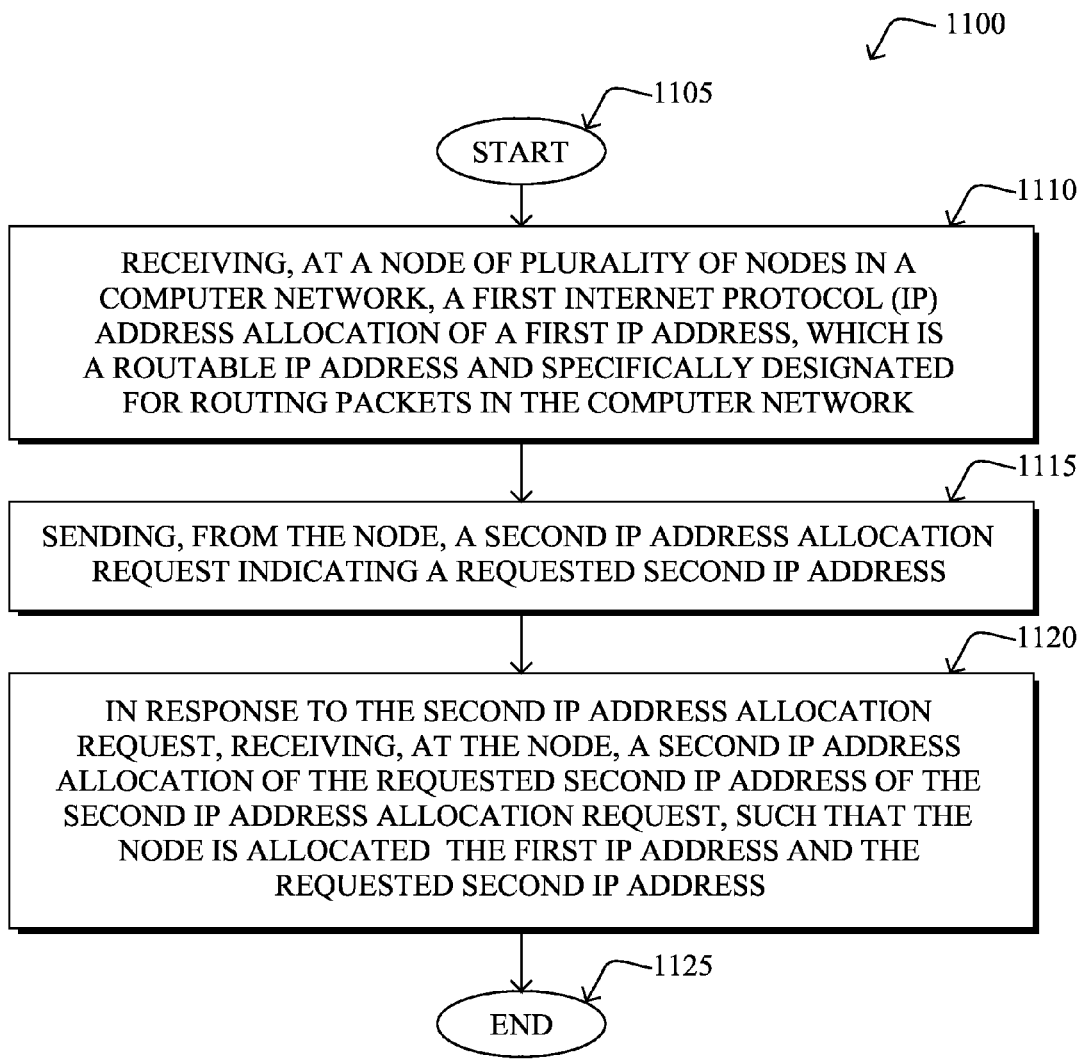
FIG. 11 illustrates an example simplified procedure for receiving an allocation of a first and a second IP address.

FIG. 11 illustrates an example simplified procedure for receiving an allocation of a first and a second IP address in accordance with one or more embodiments described herein. The procedure 1100 may start at step 1105, and continues to step 1110, where, as described in greater detail above, a first IP address allocation is received and a second IP address allocation is received.

At step 1110, a first IP address allocation of a first IP address is received at a node of a plurality of nodes in a computer network. As described above, the first IP address is a routable IP address and specifically designated for routing packets in the computer network. Also, the first IP address can be allocated to the node so as to increase a compression ratio of the first IP address and other first IP addresses by maximizing a bit-length of a common IP address prefix that is shared across the first IP address and other first IP addresses.

At step 1115, a second IP address allocation request indicating a requested second IP address is sent from the node. In response to the second IP address allocation request, at step 1120, a second IP address allocation of the requested second IP address of the second IP address allocation request is received at the node, such that the node is allocated the first IP address and the requested second IP address. Thus, when another node is communicating with the node, it is determined which of the node's first IP address or second IP address would be appropriate for communication (e.g., routing, end-user, etc.). And as explained above, a routing topology for routing packets in the computer network is constructed using only the first IP addresses.

The procedure illustrative ends at step 1125. The techniques by which the steps of procedure 1100 may be performed, as well as ancillary procedures and parameters, are described in detail above.

It should be noted that the steps shown in FIGS. 10 and 11 are merely examples for illustration, and certain other steps may be included or excluded as desired. Further, while a particular order of the steps is shown, this ordering is merely illustrative, and any suitable arrangement of the steps may be utilized without departing from the scope of the embodiments herein. Moreover, while procedures 1000 and 1100 are described separately, certain steps from each procedure may be incorporated into each other procedure, and the procedures are not meant to be mutually exclusive.

The techniques described herein, therefore, provide for minimizing source routing overhead while still supporting end-user/application-specific IPv6 addresses. Minimizing source routing overhead reduces overall channel utilization, reduces communication latency, and improves overall throughput. Another significant advantage is that the techniques described herein build on mechanisms already implemented in existing mesh networks and LLNs (i.e., DHCPv6 autoconfiguration and RPL Non-Storing mode).

While there have been shown and described illustrative embodiments that provide for DHCPv6 address autoconfiguration for source-routed networks, it is to be understood that various other adaptations and modifications may be made within the spirit and scope of the embodiments herein. For example, the embodiments have been shown and described herein with relation to LLNs. However, the embodiments in their broader sense are not as limited, and may, in fact, be used with other types of networks and/or protocols. In addition, while certain protocols are shown, such as RPL, other suitable protocols may be used, accordingly. Moreover, the techniques described herein are applicable to all versions of the Internet Protocol (e.g., IP, IPv4, IPv6, etc.). Thus, the present disclosure is not limited to a particular IP version, and particular IP versions are referenced merely for illustrative purposes. Similarly, the techniques described herein are applicable to all versions of the Dynamic Host Configuration Protocol (e.g., DHCP, DHCPv6, etc.), and thus the present disclosure is not limited to a particular DHCP version. Thus, the present disclosure is not limited to a particular DHCP version, and particular DHCP versions are referenced merely for illustrative purposes.

The foregoing description has been directed to specific embodiments. It will be apparent, however, that other variations and modifications may be made to the described embodiments, with the attainment of some or all of their advantages. For instance, it is expressly contemplated that the components and/or elements described herein can be implemented as an apparatus that comprises at least one network interface that communicates with a communication network, a processor coupled to the at least one network interface, and a memory configured to store program instructions executable by the processor. Further, it is expressly contemplated that the components and/or elements described herein can be implemented as software being stored on a tangible (non-transitory) computer-readable medium (e.g., disks/CDs/RAM/EEPROM/etc.) having program instructions executing on a computer, hardware, firmware, or a combination thereof. Accordingly this description is to be taken only by way of example and not to otherwise limit the scope of the embodiments herein. Therefore, it is the object of the appended claims to cover all such variations and modifications as come within the true spirit and scope of the embodiments herein.

What is claimed is:

1. A method, comprising:
    allocating first Internet Protocol (IP) addresses to a plurality of nodes, respectively, in a computer network, the first IP addresses being routable IP addresses and specifically designated for routing packets in the computer network;
    allowing the plurality of nodes to submit a second IP address allocation request indicating a requested second IP address, wherein
        in response to a second IP address allocation request from a particular node of the plurality of nodes, the requested second IP address of the second IP address allocation request is allocated to the particular node, such that the particular node is allocated one of the first IP addresses and the requested second IP address;
    constructing a routing topology for routing packets in the computer network using only the first IP addresses; and
    allocating the first IP addresses so as to enhance a compression ratio of the first IP addresses that are allocated across the plurality of nodes.

2. The method as in claim 1, further comprising:
    when communicating with the particular node, determining which of the particular node's first IP address or second IP address would be appropriate for communication.

3. The method as in claim 1, wherein the second IP address allocation request is submitted in accordance with an IP address allocation policy adhered to by the particular node.

4. The method as in claim 1, further comprising:
    allocating the first IP addresses to the plurality of nodes in accordance with a first-fit algorithm.

5. The method as in claim 1, further comprising:
    overlaying the second IP address of the particular node on the routing topology which is constructed using only the first IP addresses.

6. The method as in claim 1, wherein the allocation of the requested second IP address is accomplished automatically by a dynamic host configuration protocol (DHCP) IP address allocation session, and the particular node represents a DHCP client node.

7. The method as in claim 1, further comprising:
    constructing a transmission route for a packet in the computer network including one or more intermediate hops and a destination, the transmission route using only first IP addresses as the one or more intermediate hops and either one of the first IP addresses or a requested second IP address as the destination.

8. The method as in claim 7, wherein only first IP addresses are used as the one or more intermediate hops unless it is determined that it would be disadvantageous to restrict the one or more intermediate hops to only the first IP addresses.

9. A method, comprising:
    receiving, at a node of a plurality of nodes in a computer network, a first Internet Protocol (IP) address allocation of a first IP address, which is a routable IP address and specifically designated for routing packets in the computer network;
    sending, from the node, a second IP address allocation request indicating a requested second IP address; and
    in response to the second IP address allocation request, receiving, at the node, a second IP address allocation of the requested second IP address of the second IP address allocation request, such that the node is allocated the first IP address and the requested second IP address, wherein
    a routing topology for routing packets in the computer network is constructed using only the first IP addresses, wherein the first IP address is allocated to the node so as to increase a compression ratio of the first IP address and other first IP addresses by maximizing a bit-length of a common IP address prefix that is shared across the first IP address and other first IP addresses.

10. The method as in claim 9, wherein when another node is communicating with the node, it is determined which of the node's first IP address or second IP address would be appropriate for communication.

11. The method as in claim 9, wherein the allocation of the requested second IP address is accomplished automatically by a dynamic host configuration protocol (DHCP) IP address allocation session, and the node represents a DHCP client node.

12. An apparatus, comprising:
    one or more network interfaces to communicate with a computer network;
    a processor coupled to the one or more network interfaces and adapted to execute a process; and
    a memory configured to store program instructions which include the process executable by the processor, the process comprising:
        allocating first Internet Protocol (IP) addresses to a plurality of nodes, respectively, in the computer network, the first IP addresses being routable IP addresses and specifically designated for routing packets in the computer network;
        allowing the plurality of nodes to submit a second IP address allocation request indicating a requested second IP address, wherein
            in response to a second IP address allocation request from a particular node of the plurality of nodes, the requested second IP address of the second IP address allocation request is allocated to the particular node, such that the particular node is allocated one of the first IP addresses and the requested second IP address;

constructing a routing topology for routing packets in the computer network using only the first IP addresses; and allocating the first IP addresses so as to enhance a compression ratio of the first IP addresses that are allocated across the plurality of nodes.

13. The apparatus as in claim 12, wherein the process further comprises:

when communicating with the particular node, determining which of the particular node's first IP address or second IP address would be appropriate for communication.

14. The apparatus as in claim 12, wherein the second IP address allocation request is submitted in accordance with an IP address allocation policy adhered to by the particular node.

15. The apparatus as in claim 12, wherein the process further comprises:

allocating the first IP addresses to the plurality of nodes in accordance with a first-fit algorithm.

16. The apparatus as in claim 12, wherein the process further comprises:

overlaying the second IP address of the particular node on the routing topology which is constructed using only the first IP addresses.

17. The apparatus as in claim 12, wherein the allocation of the requested second IP address is accomplished automatically by a dynamic host configuration protocol (DHCP) IP address allocation session, and the particular node represents a DHCP client node.

18. The apparatus as in claim 12, wherein the process further comprises:

constructing a transmission route for a packet in the computer network including one or more intermediate hops and a destination, the transmission route using only first IP addresses as the one or more intermediate hops and either one of the first IP addresses or a requested second IP address as the destination.

19. The apparatus as in claim 18, wherein only first IP addresses are used as the one or more intermediate hops unless it is determined that it would be disadvantageous to restrict the one or more intermediate hops to only the first IP addresses.

20. An apparatus, comprising:

one or more network interfaces to communicate with a computer network;

a processor coupled to the one or more network interfaces and adapted to execute a process; and a memory configured to store program instructions which include the process executable by the processor, the process comprising:

receiving, as a node of a plurality of nodes in the computer network, a first Internet Protocol (IP) address allocation of a first IP address, which is a routable IP address and specifically designated for routing packets in the computer network;

sending, from the node, a second IP address allocation request indicating a requested second IP address; and in response to the second IP address allocation request, receiving, at the node, a second IP address allocation of the requested second IP address of the second IP address allocation request, such that the node is allocated the first IP address and the requested second IP address, wherein a routing topology for routing packets in the computer network is constructed using only the first IP addresses, wherein the first IP address is allocated to the node so as to increase a compression ratio of the first IP address and other first IP addresses by maximizing a bit-length of a common IP address prefix that is shared across the first IP address and other first IP addresses.

21. The apparatus as in claim 20, wherein the allocation of the requested second IP address is accomplished automatically by a dynamic host configuration protocol (DHCP) IP address allocation session, and the node represents a DHCP client node.

* * * * *